United States Patent
Huang et al.

(10) Patent No.: US 6,822,869 B2
(45) Date of Patent: Nov. 23, 2004

(54) FASTENING DEVICE

(75) Inventors: Wen-Shi Huang, Taoyuan (TW);
Kuo-Cheng Lin, Taoyuan (TW);
Yu-Hung Huang, Ilan (TW); Li-Kuang Tan, Taoyuan (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 52 days.

(21) Appl. No.: 10/342,212

(22) Filed: Jan. 15, 2003

(65) Prior Publication Data

US 2003/0210528 A1 Nov. 13, 2003

(30) Foreign Application Priority Data

May 7, 2002 (TW) ........................................ 91206377 U

(51) Int. Cl.[7] .............................................. H05K 7/20
(52) U.S. Cl. ........................... 361/704; 26/457; 26/458; 165/80.3; 165/185; 248/510; 257/719; 257/727; 361/710
(58) Field of Search .................. 24/295–296, 457–458, 24/573, 625; 165/80.3, 185, 80.2; 174/16.3; 248/505, 510; 257/718–719, 726–727; 361/697, 706, 707, 710, 719–720

(56) References Cited

U.S. PATENT DOCUMENTS

| | | | | |
|---|---|---|---|---|
| 5,448,449 A | * | 9/1995 | Bright et al. | 361/704 |
| 5,684,676 A | * | 11/1997 | Lin | 361/704 |
| 5,771,960 A | * | 6/1998 | Lin | 165/80.3 |
| 6,430,049 B1 | * | 8/2002 | Lai et al. | 361/704 |
| 6,466,443 B1 | * | 10/2002 | Chen | 361/695 |

* cited by examiner

*Primary Examiner*—Gregory Thompson
(74) *Attorney, Agent, or Firm*—Birch, Stewart, Kolasch & Birch, LLP

(57) ABSTRACT

A fastening device is used to tightly attach the heat sink on an electronic element. The fastening device includes an elastic arm, a first latch element and a second latch element. The elastic arm has a first axial part, a second axial part, and a press part. The first latch element is secured to one side of the socket for mounting the electronic element thereon and pivotally coupled to the first axial part, and the second latch element is pivotally coupled to the second axial part. As the elastic arm turns about the first latch element and crosses the heat sink, the second latch element is allowed to be fastened onto another side of the socket. Thus, the press part of the elastic arm would urge against the heat sink to enable the heat sink to be tightly attached on the electronic element.

17 Claims, 9 Drawing Sheets

FASTENING DEVICE

FIELD OF THE INVENTION

The invention relates to a fastening device for fixing the heat sink to electronic elements.

BACKGROUND OF THE INVENTION

In computer systems, the operation temperature of each electronic element has an impact on normal system functions. To ensure that the computer systems function reliably, they must be equipped with a heat-dissipating device. In a computer system, the central processing unit (CPU) is the main process center that usually generates the highest operation temperature, thus requiring the most demanding of heat dissipating functions.

The commonly adopted heat dissipation design for CPUs at the present time is to mount a heat sink on the CPU and install a fan on the heat sink. The heat generated by the CPU is transferred to the heat sink, and the fan provides airflow to pass through the heat sink to perform heat exchange processes and thereby achieves heat dissipation. In the design set forth above, the bonding relationship between the heat sink and the CPU affects heat transfer. Hence, the heat sink and the CPU must be in close contact with each other to achieve effective heat transfer. In the prevailing design at present, the heat sink and the CPU are two separate elements so that the common way for assembling the heat sink with the CPU is to adopt a U-shaped clip to be latched onto hooks located on two sides of a CPU base. The U-shaped clip functions like a bridge and provides a downward force to put the heat sink in close contact with the CPU. Usually, users have to exert a strong force to engage one end of the U-shaped clip to the CPU base. Although such a design gives the heat sink a strong pressing force, it is difficult for users to handle. When the force is not applied properly (or unevenly), the CPU or the mother board for mounting the CPU will be easily damaged.

SUMMARY OF THE INVENTION

The primary object of the invention is to provide a fasting device for users to easily and fast assemble the heat sink with the CPU.

The fastening device of the invention includes an elastic arm, a first latch element and a second latch element. The first and the second latch elements can be pivotally engaged with two ends of the elastic arm. The first latch element has a pair of engaging members to engage with a retaining hole located on one side of a socket. The second latch element has a snap hook and a head located on the opposite side of the snap hook. With the first latch element serving as the axis, the elastic arm can cross onto the heat sink. The second latch element may be turn to engage with another corresponding retaining hole located on the other side of the socket through the hook such that the press part in the middle portion of the elastic arm can firmly urge the heat sink against the electronic element.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 4A:
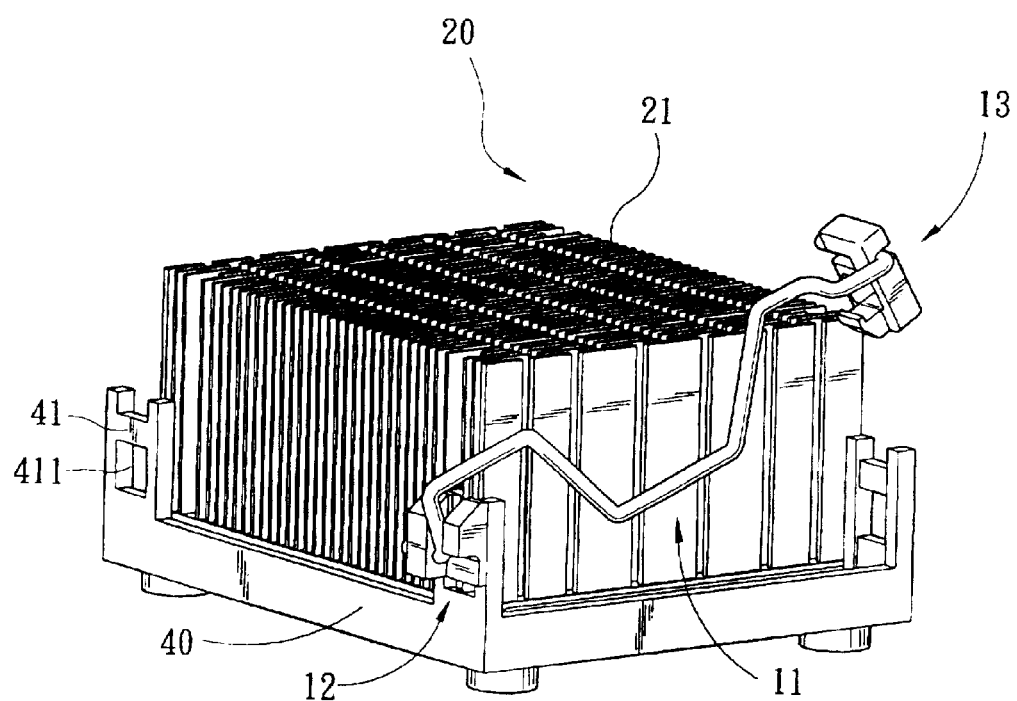
FIGS. 4A and 4B are schematic views of an embodiment of a heat-dissipating assembly of the invention using the fastening device during the assembling process.
Figure 4B:
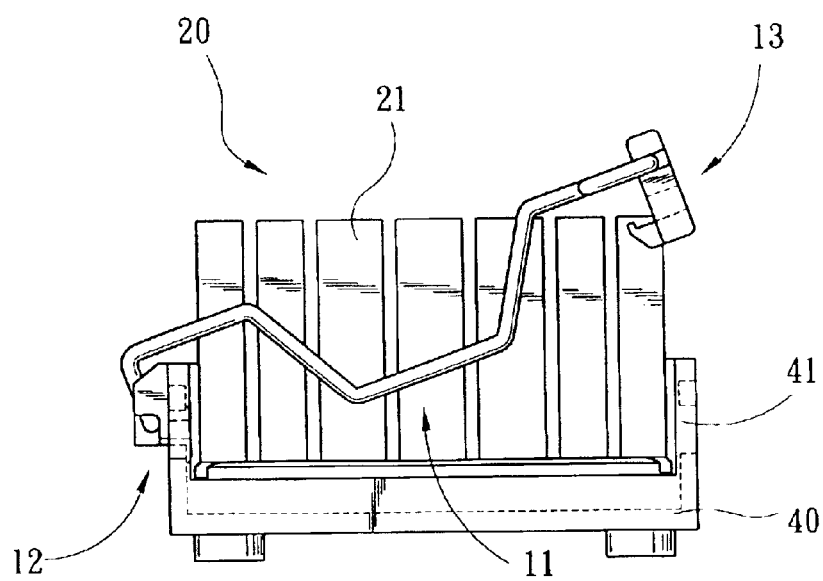
Figure 5A:
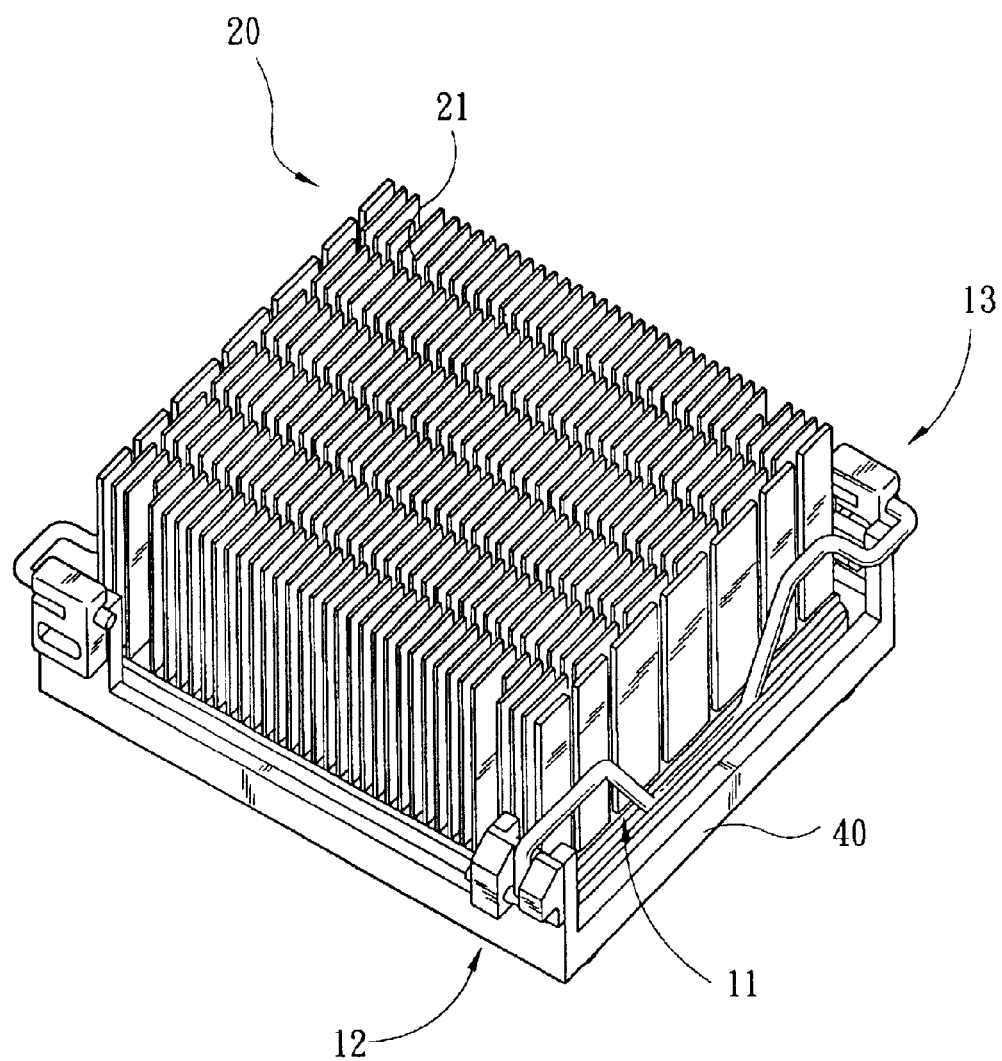
FIGS. 5A and 5B are schematic views of FIG. 4A or 4B after assembly.
Figure 5B:
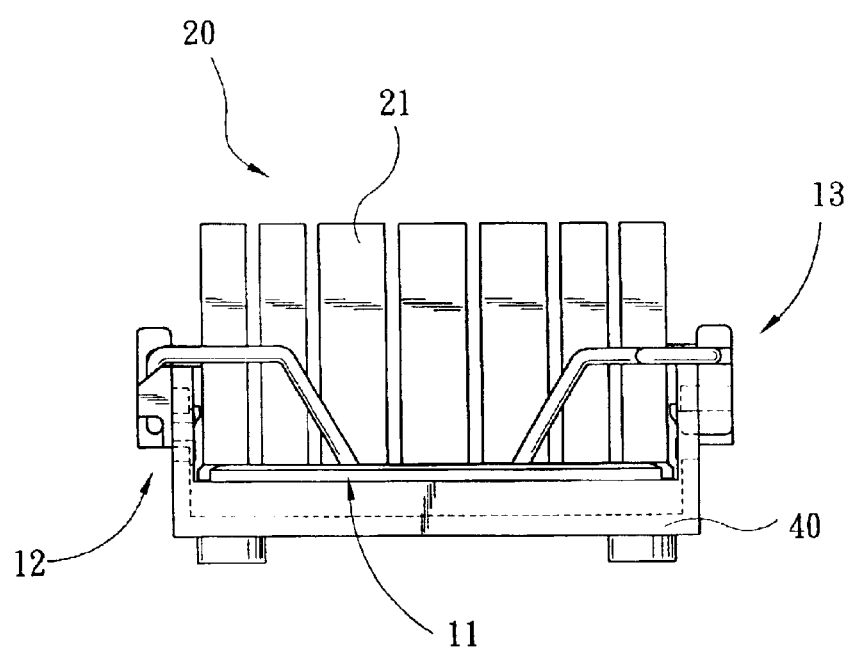

Referring to FIG. 4A, the fastening device of the invention is provided for securing a heat sink 20 to an electronic element (not shown in the drawing). The electronic element can be a central processing unit (CPU) of a computer system which is the main heat source. When assembling, the CPU is accommodated in the socket 40 and the heat sink 20 is mounted on the CPU to perform a heat exchange with the CPU. The heat sink 20 has a plurality of fins 21 to form a bigger area to dissipate the heat generated by the CPU. In addition, there is a cooling fan (not shown in the drawing) installed on the heat sink 20 to generate airflow to pass through the heat sink 20 for dissipating the heat accumulated in the heat sink. The most CPU is the Pentium 4 2.20 GHz made by Intel Corporation. The mother board in the computer has the socket 40 for accommodating the CPU (the standard specification). Manufacturers have to design heat sinks and fastening mechanisms for assembling the heat sink 20 to the socket 40 corresponding to this standard specification. The standard socket 40 is a substantially square frame with four sides, each of which has a bracket 41 located thereon. The bracket 41 has a retaining hole 411.

Figure 1:
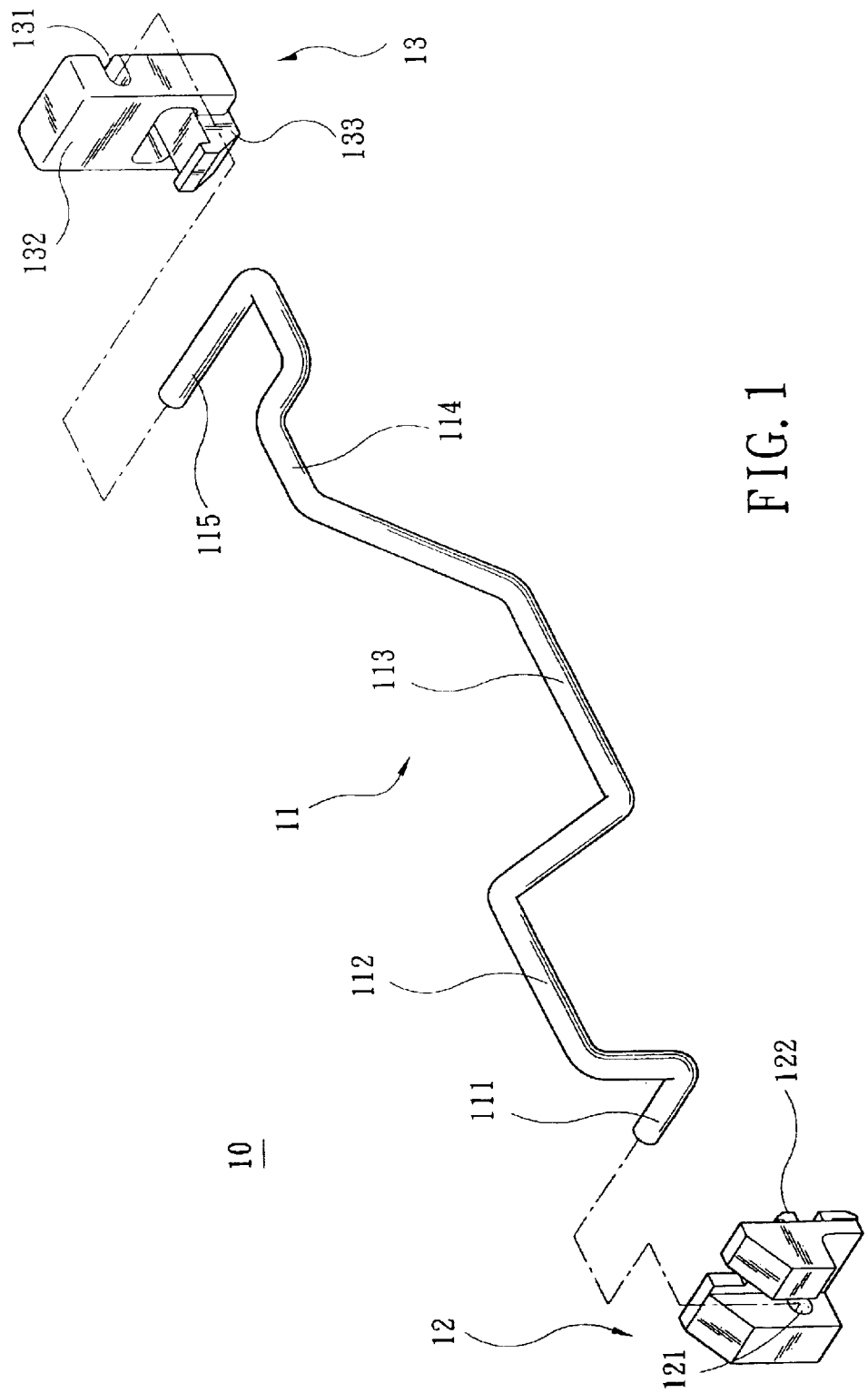
FIG. 1 is an exploded view of a preferred embodiment of a fastening device of the invention.
Figure 2:
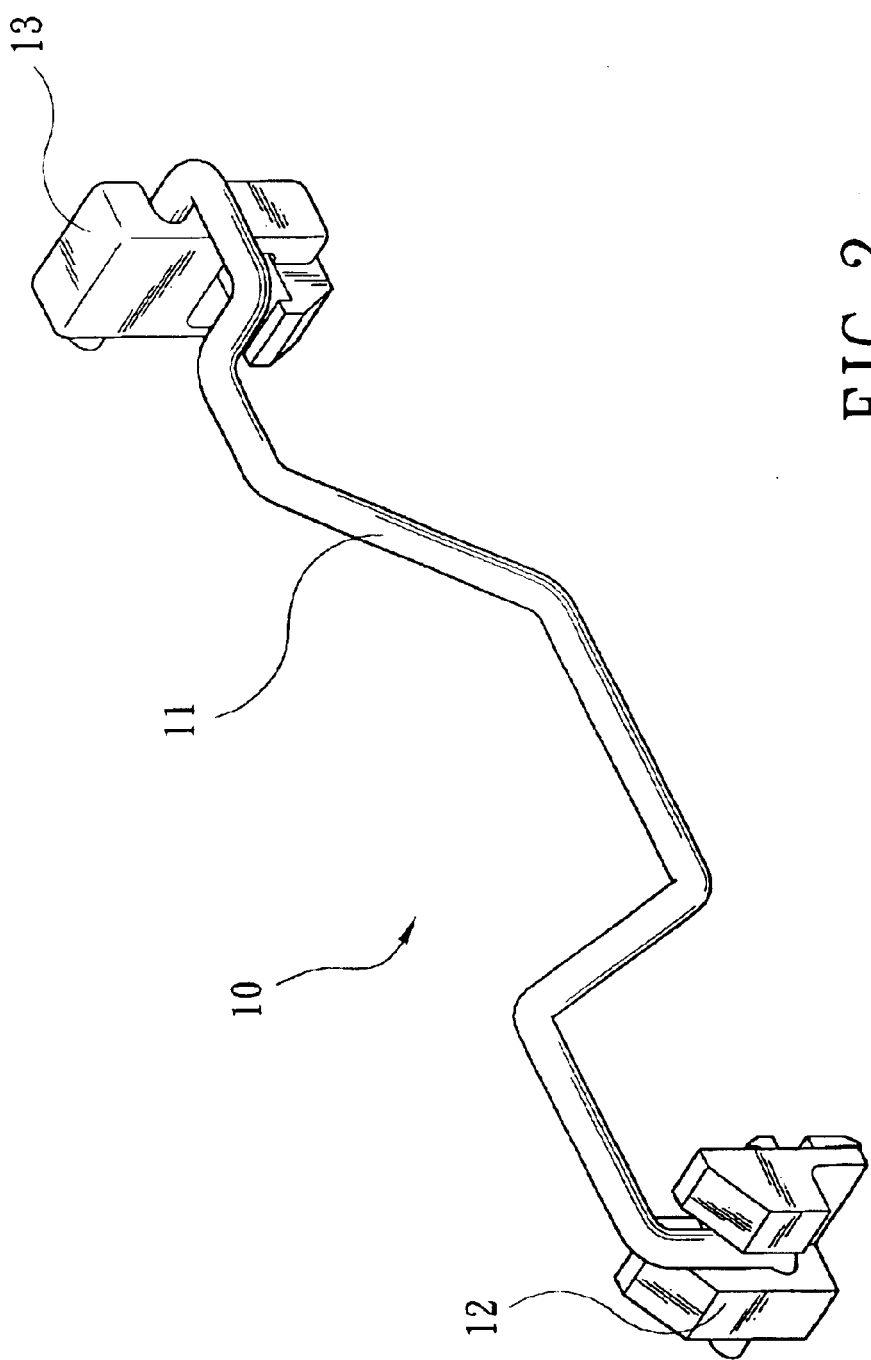
FIG. 2 is a perspective view of the fastening device of FIG. 1.
Figure 3:
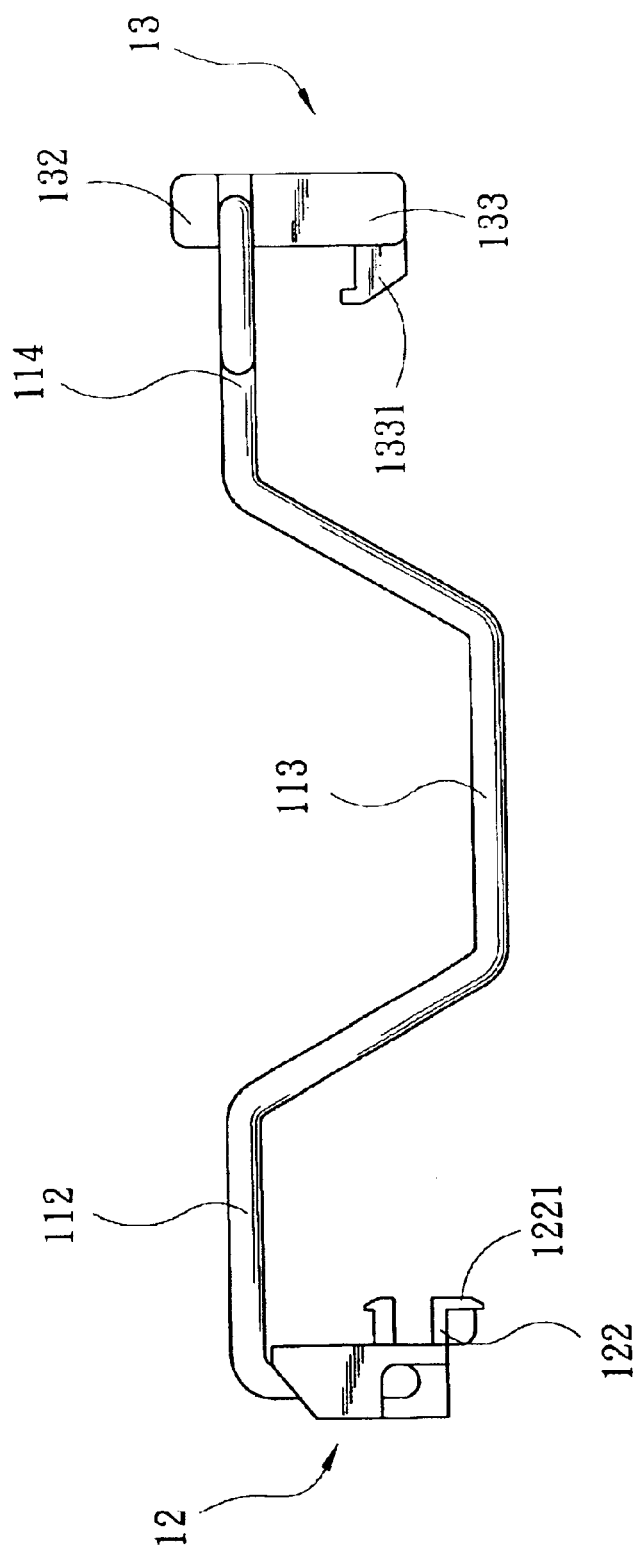
FIG. 3 is a side view of the fastening device of FIG. 2.

Referring to FIGS. 1, 2 and 3, the fastening device 10 of the invention includes an elastic arm 11, a first latch element 12 and a second latch element 13.

The elastic arm 11 is made from an elongated metal strip. According to the bent profile, the elastic arm 11 can be divided into a first axial part 111, a first end 112, a press part 113, a second end 114 and a second axial part 115. When taking a plane view of the elastic arm 11, the first end 112 and the second end 114 are located at a higher elevation, and the press part 113 is located at a lower elevation as shown in FIG. 2 or FIG. 3. There is a distance between the first end 112 and the press part 113, and between the second end 114 and the press part 113. When the first end 112 is anchored and the press part 113 rests on a flat surface, the second end 114 may be pressed downwards by force for anchoring. In such a situation, the elasticity of the metal strip enables the press part 113 to press the flat surface with a desired pressure. The fist axial part 111 and the second axial part 115 are pivotally and respectively engaged with the first latch element 12 and the second latch element 13.

The first latch element 12 is made from plastic and is substantially formed in a square shape. It has a first latch hole 121 formed on one side to pivotally engage with the first axial part 111 of the elastic arm 11 such that the first latch element 12 may be rotated about the first axial part 111. The first latch element 12 further has a pair of engaging members 122 located on the side opposite to that of the first latch hole 121. The interval between two engaging members 122 is approximately equal to the length of the retaining hole 411 of the bracket 41. The engaging member 122 have a hook 1221 extending outwards. The hook 1221 has an inclined surface to enable the engaging members 122 to be pressed and bent slightly for wedging into the retaining hole 411. Once the engaging members 122 are wedged into the retaining hole 411, the elasticity of the plastic enables the engaging members 122 to restore to their original positions to allow the hooks 1221 to engage with the retaining hole 411. Thus, the first latch element 12 can be anchored on the bracket 41 and the elastic arm 11 may be rotated about the first latch element 12.

The second latch element 13 is made from plastic and is substantially formed in a square shape. It has a second latch hole 131 formed on one side to pivotally engage with the second axial part 115 of the elastic arm 11 such that the second latch element 13 can pivot about the second axial part 115. The second latch hole 131 is formed at a location about one third of the second latch element 13. The upper section of the latch element 13 above the second latch hole 131 is a head 132 while the lower section below the second latch hole 131 is a latch section 133. The latch section 133 has a hook 1331 located at the bottom of one side opposite to that of the second latch hole 131. The hook 1331 of the latch section 133 may be wedged into the retaining hole 411 by applying an external force on the head such that the second latch element 13 can be anchored on another bracket 41.

Referring to FIGS. 4A, 4B, 5A and 5B, the socket 40 is mounted on a mother board (not shown in the drawings) where the CPU is disposed. The heat sink 20 is mounted on the socket 40. First of all, the heat sink 20 is placed on the socket 40 and the engaging members 122 of the first latch element 12 is engaged with the retaining hole 411 of one bracket 41 to fix the first latch element 12 onto the bracket 41. Then the elastic arm 11 pivots about the first latch element 12 and cross the heat sink 20, wherein the press part of the elastic arm 11 urges against the heat sink 20 and users can apply a force on the head to engage the latch section 33 with the retaining hole 411 such that the second latch element 13 can be secured on the bracket 41. Similarly, another fastening device is secured on the other side of the socket 40 in the same direction or an opposite direction according to the above-described steps. With the first latch element 12 and the second latch element 13 anchored on the brackets 41, the press part 113 can press the heat sink 20 so that the heat sink 20 can be tightly fixed on the CPU.

The fastening device 10 of the invention is designed according to the standard socket 40. There is no need to change the heat sink 20 or the socket 40. It should be noted that the second latch element 13 is pivotally engaged with one end of the elastic arm 11. When the elastic arm 11 pivots to the position corresponding to the retaining hole 411, the user can easily grip the head 132 of the second latch element 13 to turn the second latch element 13 about the elastic arm 11 and engage the hook 1331 of the latch section 133 with the retaining hole 411. The operation is easy and does not require great force. Thus, the damage on the mother board or CPU resulting from unevenly external force can be prevented. The operation also does not require any tools.

Figure 6A:
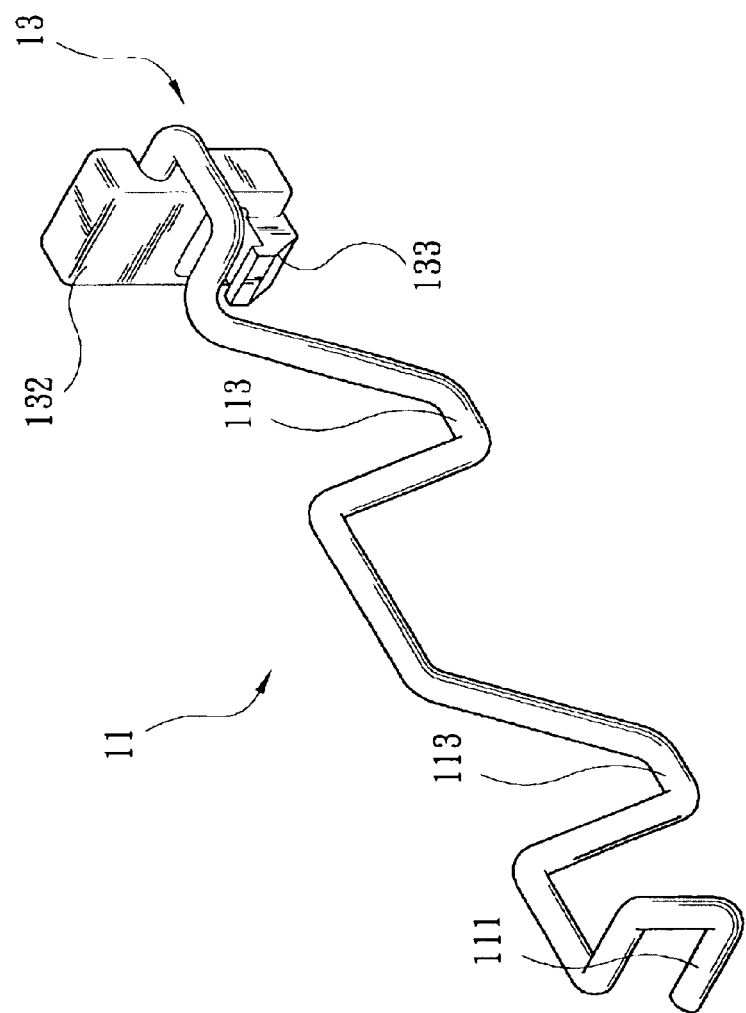
FIGS. 6A and 6B are schematic views of another embodiment of the heat-dissipating assembly of the invention using another type of the fastening device.
Figure 6B:
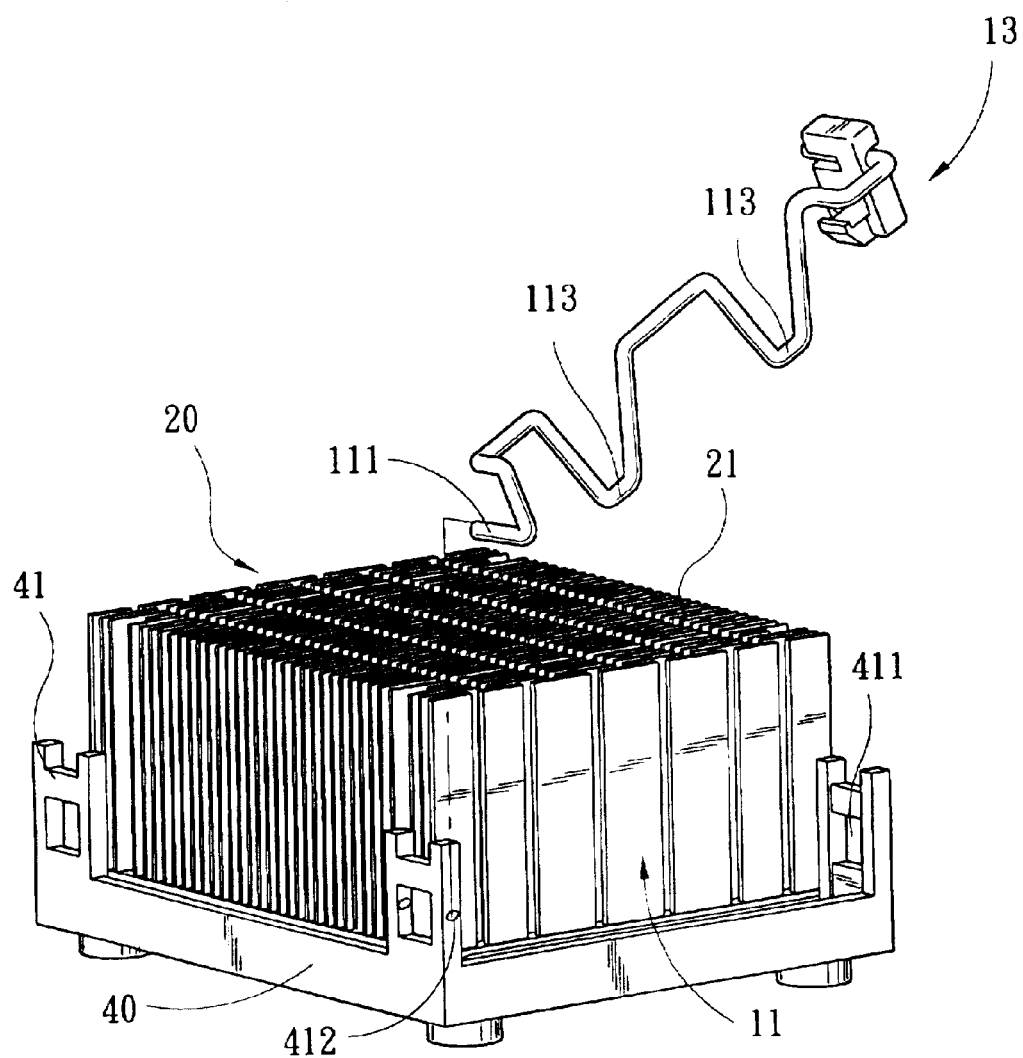

Please refer to FIGS. 6A and 6B showing another embodiment of the invention. There are two press part 113 formed at two sides of the elastic arm 11. There are latch holes provided alongside the retaining hole 411 of the socket 40 for allowing the first axial part 111 of the elastic arm 11 to be inserted therein such that the elastic arm 11 can be pivotally connected to the socket 40. Then, the elastic arm 11 cross the heat sink 20 to allow the press part 113 to urge against the heat sink 20. User can grip the head 132 to engage the latch section 133 with the retaining hole 411.

Thus, the second latch element 13 can be anchored on the bracket 41, and the heat sink 20 can be securely anchored on the socket 40.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A fastening device for securing a heat sink to an electronic element mounted on a socket having a plurality of brackets located on the peripheral sides thereof, the fastening device comprising:

an elastic arm having a first axial part, a second axial part, and a press part;

a first latch element secured to one bracket and pivotally coupled to the first axial part; and a second latch element pivotally coupled to the second axial part;

wherein the elastic arm is turned about the first latch element and across the heat sink to allow the second latch element to be fastened onto another bracket such that the press part of the elastic arm will urge against the heat sink to enable the heat sink to be tightly attached on the electronic element.

2. The fastening device of claim 1, wherein the elastic arm is made from an elongated metal strip.

3. The fastening device of claim 1, wherein the elastic arm includes a first end, and a second end on two sides thereof and the press part is positioned lower than the first end and the second end.

4. The fastening device of claim 1, wherein the first latch element further has a first latch hole to pivotally engage with the first axial part to make the first latch element turnable about the first axial part.

5. The fastening device of claim 1, wherein the first latch element has a plurality of hooks, each of which has an inclined surface on a front tip thereof, to be engaged with a retaining hole of the bracket.

6. The fastening device of claim 1, wherein the second latch element further has a second latch hole to pivotally engage with the second axial part to make the second latch element turnable about the second axial part.

7. The fastening device of claim 6, wherein the second latch element further includes a head for users to apply an external force, and a latch section with a hook formed thereon so as to secure the second latch element on the another bracket.

8. A fastening device for securing a heat sink to an electronic element mounted on a socket having a plurality of brackets located on the peripheral sides thereof, the fastening device comprising:

an elastic arm having a first axial part, a second axial part, and a press part;

a latch element secured to one bracket and pivotally coupled to the first axial part; and wherein the elastic arm is turned about the first axial part and across the heat sink to allow another latch element to be fastened onto another bracket such that the press part of the elastic arm will urge against the heat sink to enable the heat sink to be tightly attached on the electronic element.

9. The fastening device of claim 8, wherein the another latch element further has a latch hole to pivotally engage with the second axial part to make the another latch element turnable about the second axial part.

10. The fastening device of claim 8, wherein the another latch element further includes a head for users to apply an external force, and a latch section with a hook so as to secure the another latch element on the another bracket.

11. A fastening device for securing a heat sink onto a socket which has an electronic element mounted thereon, comprising:
   an elastic arm having at least one press part and one end pivotally coupled to one side of the socket through a pivoting connection so as to allow said elastic arm to rotate about said connection; and
   a latch element pivotally coupled to another end of the elastic arm;
   wherein when assembling the elastic arm across the heat sink to allow the latch element to be secured to another side of the socket such that the press part urges against the heat sink so as to tightly attach the heat sink to the electronic element.

12. The fastening device of claim 11, wherein the elastic arm is made from an elongated metal strip.

13. A fastening device for securing a heat sink onto a socket which has an electronic element mounted thereon, comprising:
   an elastic arm having at least one press part and one end pivotally coupled to one side of the socket; and
   a latch element pivotally coupled to another end of the elastic arm;
   wherein when assembling the elastic arm across the heat sink to allow the latch element to be secured to another side of the socket such that the press part urges against the heat sink so as to tightly attach the heat sink to the electronic element; and
   wherein the elastic arm includes said ends on two sides thereof and the press part is positioned lower than said ends.

14. The fastening device of claim 13, wherein the socket further has a latch hole to pivotally engage with the one end to make the latch element turnable about the one end.

15. The fastening device of claim 14, wherein the latch element further has a latch hole to pivotally engage with the other end to make the latch element turnable about the other end.

16. The fastening device of claim 15, wherein the latch element further includes a head for users to apply an external force, and a latch section with a hook so as to secure the latch element on the another side of the socket.

17. A fastening device for securing a heat sink onto a socket which has an electronic element mounted thereon, comprising:
   an elastic arm having at least one press part and one end pivotally coupled to one side of the socket; and
   a latch element pivotally coupled to another end of the elastic arm;
   wherein when assembling the elastic arm across the heat sink to allow the latch element to be secured to another side of the socket such that the press part urges against the heat sink so as to tightly attach the heat sink to the electronic element; and
   another latch element having at least one engaging member to be engaged with a retaining hole formed on the one side of the socket, and said another latch element having a latch hole which is pivotally attached to the one end of the elastic arm.

* * * * *